United States Patent [19]

McShane et al.

[11] Patent Number: 5,157,480

[45] Date of Patent: Oct. 20, 1992

[54] SEMICONDUCTOR DEVICE HAVING DUAL ELECTRICAL CONTACT SITES

[75] Inventors: Michael B. McShane; Paul T. Lin, both of Austin, Tex.

[73] Assignee: Motorola, Inc., Schaumburg, Ill.

[21] Appl. No.: 651,166

[22] Filed: Feb. 6, 1991

[51] Int. Cl.⁵ .................. H01L 23/02; H01L 23/12
[52] U.S. Cl. ........................... 357/74; 357/68; 357/70; 357/72; 174/52.4; 361/404; 361/405; 361/410; 439/61; 439/68; 439/70
[58] Field of Search .............. 361/404, 405, 410; 174/52.4; 439/60, 61, 68, 69, 70, 71, 72; 357/68, 72, 74, 70

[56] References Cited

U.S. PATENT DOCUMENTS

| | | | |
|---|---|---|---|
| 4,089,575 | 5/1978 | Grabbe | 174/52.4 |
| 4,540,226 | 9/1985 | Thompson et al. | 439/69 |
| 4,545,610 | 10/1985 | Lakritz et al. | 439/69 |
| 4,595,794 | 6/1986 | Wasserman | 439/71 |
| 4,647,126 | 3/1987 | Sobota, Jr. | 361/405 |
| 4,873,615 | 10/1989 | Grabbe | 174/52.4 |
| 4,969,827 | 11/1990 | Hahs, Jr. | 357/68 |
| 5,006,922 | 4/1991 | McShane et al. | 357/74 |
| 5,043,794 | 8/1991 | Tai et al. | 357/74 |

Primary Examiner—Rolf Hille
Assistant Examiner—David Ostrowski
Attorney, Agent, or Firm—Patricia S. Goddard

[57] ABSTRACT

A semiconductor device having both bottom-side contacts and peripheral contacts provides surface mounting options. In one form, a semiconductor device die is positioned at a die receiving area of a leadframe. The leadframe also has a plurality of leads, each lead having a first and a second contact portion which are separated by an intermediate portion. A package body encapsulates the semiconductor device die and intermediate portions of the plurality of leads. The first contact portions of the leads are partially exposed on the bottom surface of the package body. The second contact portions extend from the package body along a portion of the package body perimeter. The first contact portions provide bottom-side contacts to the device, while the second contact portions provide peripheral contacts. The second contact portions are shaped into a desired lead configuration or are severed to establish a leadless device.

15 Claims, 3 Drawing Sheets

SEMICONDUCTOR DEVICE HAVING DUAL ELECTRICAL CONTACT SITES

CROSS-REFERENCE TO RELATED APPLICATION

This application is related to a commonly assigned co-pending patent application entitled, "Leadless Semiconductor Device and Method for Making the Same," by Casto, filed Feb. 6, 1991, Ser. No. 07/651,165.

TECHNICAL FIELD OF THE INVENTION

The present invention is related to semiconductor devices in general, and more specifically, to packaged semiconductor devices having dual electrical contact sites and methods for making the same.

BACKGROUND OF THE INVENTION

In order to meet the demand of the growing electronics industry, semiconductor manufacturers are faced with many challenges in supplying suitable semiconductor devices. One challenge is to provide customers with very small, yet powerful, devices. However, this challenge is not easily met. As the power and performance of a device increases, the heat dissipated during the operation of the device also increases. Operating a device at high temperatures is undesirable because heat can lead to a reduced operating lifetime of the device and can also affect the operation of other components within an electronic system. While methods for handling an increased device temperature exist, for instance the addition of a heat sink to the device, these methods usually increase the overall size of the device significantly.

Furthermore, powerful devices also require a large number of pins or leads to electrically access the semiconductor die. In an effort to accommodate a large number of leads in a small package, many manufactures use thin, fragile, densely spaced leads. The use of such leads creates a variety of manufacturing and handling problems. Handling devices with such fragile leads can result in bent and non-coplanar leads, making it difficult to properly mount the device to a substrate, such as a PC (printed circuit) board.

Therefore, a need exists for an improved semiconductor device, and more specifically for an improved semiconductor device which is small, can be easily adapted to dissipate heat without increasing the size of the device, and is less susceptible to lead damage.

BRIEF SUMMARY OF THE INVENTION

The previously mentioned need is fulfilled and other advantages are achieved with the present invention. In one form, a semiconductor device having dual electrical contact sites has a semiconductor device die. The semiconductor device die is electrically coupled to a plurality of conductive leads. Each lead has a first contact portion and a second contact portion separated from the first contact portion by an intermediate portion. A package body encapsulates the semiconductor device die and intermediate portions of the plurality of conductive leads. First contact portions of the leads are exposed on a surface of the package body while second contact portions are exposed on a side of the package body which is adjacent the surface.

DETAILED DESCRIPTION OF A PREFERRED EMBODIMENT

With the present invention, it is possible to achieve several desirable features of a semiconductor device. The present invention enables a semiconductor device size to be kept to a minimum. Small devices are particularly important for use in consumer and portable electronics applications. Another advantage is that a semiconductor device in accordance with the present invention can dissipate heat without increasing the device size. Heat dissipation is of great concern, particularly for high-performance devices which consume a great deal of power. Yet another advantage of the invention is that a semiconductor device is equipped with more than one way of electrically accessing an internal semiconductor die. Typically, a semiconductor device has a set of conductive leads which are external to a protective package body and which provide the only way to electrically access the die. The present invention also has a set of conductive leads, but has two different ways of electrically accessing the die and furthermore has various ways for improving thermal performance of the device. The flexibility of having several ways to access and thermally enhance the semiconductor device die allows a semiconductor manufacturer to have a more diverse product portfolio without having to use specialized manufacturing operations for each product. Furthermore, the present invention can be made either as a leaded or leadless semiconductor device, thereby establishing greater flexibility.

Figure 1:
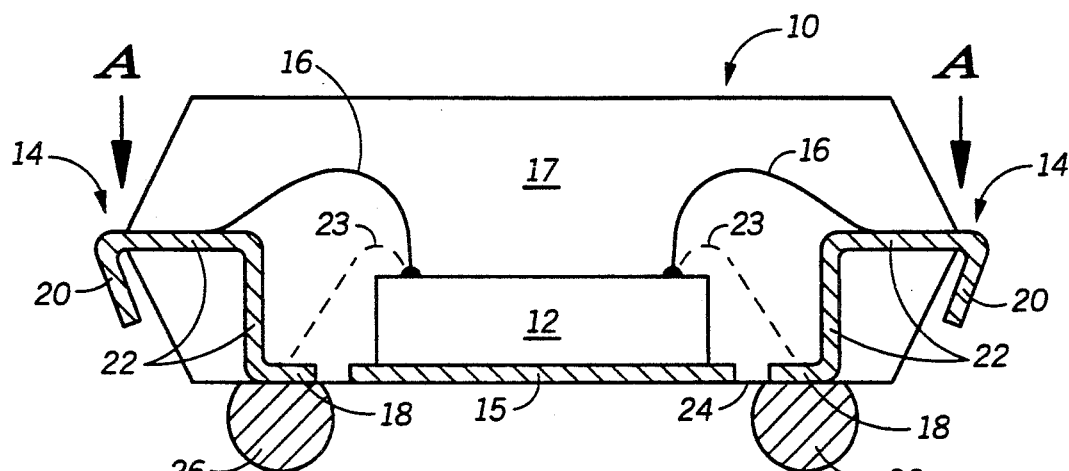
FIG. 1 illustrates, in cross-section, a semiconductor device in accordance with the present invention.

Illustrated in FIG. 1 is a cross-sectional view of a semiconductor device 10 in accordance with the present invention. The device has a semiconductor device die 12, such as an integrated circuit die. Also included in device 10 is a leadframe (not shown entirely) having a plurality of leads 14 and a die receiving area 15. Leadframe materials commonly used in semiconductor devices are suitable for use with the present invention, for instance cooper or iron-nickel alloy leadframes. The plurality of leads 14 are electrically coupled to die 12 by wire bonds 16, although any coupling technique may be used. Wire bonds 16 provide electrical accessibility to die 12 via leads 14. A protective package body 17 is formed around die 12, also encapsulating wire bonds 16, portions of die receiving area 15, and portions of leads 14. Package body 17 is made from conventional encapsulating materials, such as a resin-filled epoxy or other molding compound. In order to provide good thermal performance, a surface of die receiving area 15 is exposed on, and substantially flush with, a bottom surface 24 of package body 17. Having the die receiving area exposed, and perhaps coupled to a heat dissipator, allows heat to be removed from semiconductor device die 12 to the ambient such that the device operates within a suitable temperature range. The advantage of good thermal performance is achieved without added weight or size to the semiconductor device, unlike many conventional heat dissipating devices.

For the purpose of fully understanding the present invention, it is helpful to further discuss the leads of semiconductor device 10 illustrated in FIG. 1. Each of the plurality of leads 14 can be divided into three portions: a first contact portion 18; a second contact portion 20; and an intermediate portion 22. First contact portion 18 is formed such that it is initially exposed on a portion of bottom surface 24 of package body 17 and is also substantially flush with the bottom surface. The exposed first contact portions 18 enable one to access semiconductor die 12 from the bottom of the package. Using bottom-side contacts, space is conserved on a mounting substrate, such as a PC board, due to the absence of peripheral leads that many conventional semiconductor packages possess.

Figure 5:
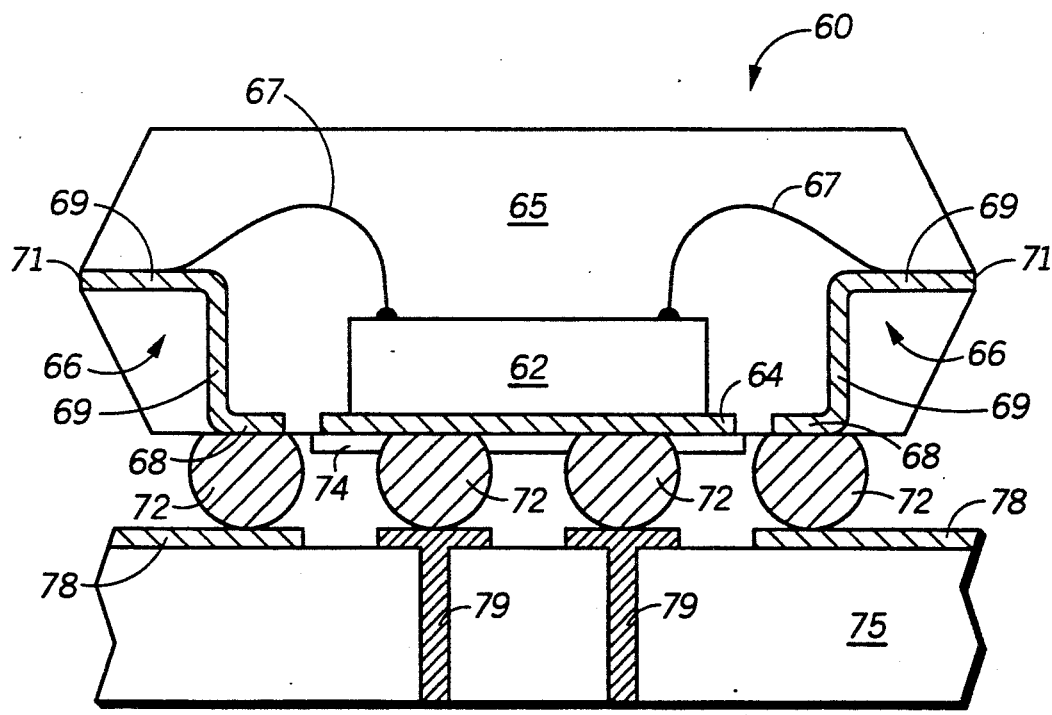
FIG. 5 and FIG. 6 illustrate, in cross-section, applications in which a semiconductor device in accordance with the present invention can be mounted on a substrate for improved thermal performance.
Figure 6:
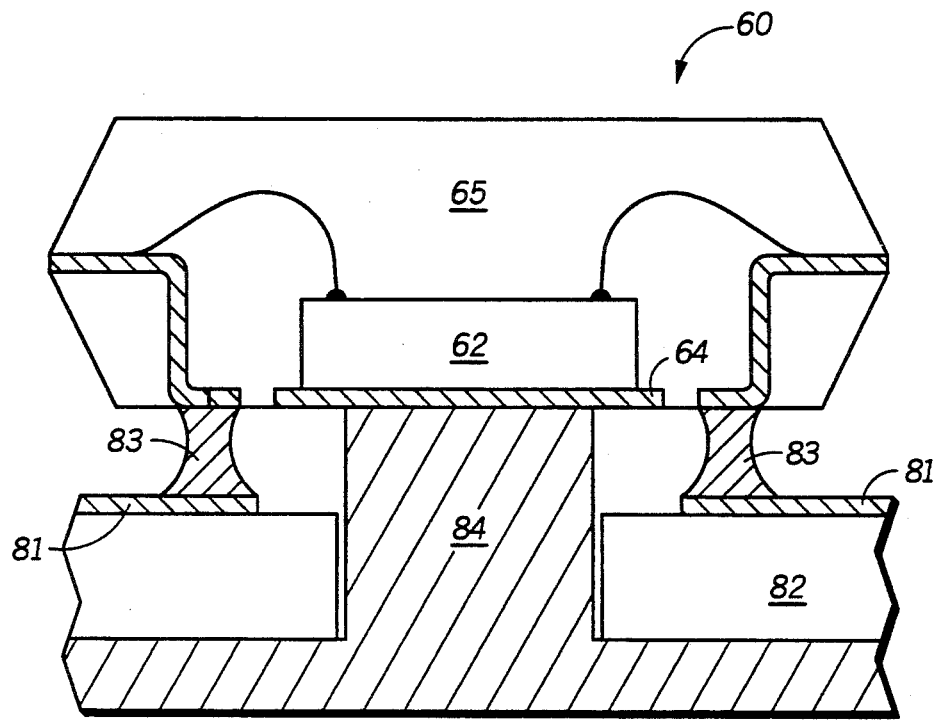

First contact portions 18 can be electrically coupled to a mounting substrate in any of several ways. As illustrated in FIG. 1, solder balls 26 are attached to the exposed first contact portions of the leads. Solder balls may be attached using known soldering methods including solder reflow techniques. The solder balls are subsequently coupled to a substrate to provide electrical access from the substrate to the device. Examples of the use of solder balls to mount a device in accordance with the present invention to a PC board are illustrated in FIG. 5 and FIG. 6 and will be described in more detail later. An alternative board mounting method is to screen print with solder paste or pre-plate a PC board with a pattern which corresponds to the pattern of the exposed first portions of the leads. The device is then appropriately positioned on the PC board and the solder is reflowed.

Second contact portions 20 of the leads of the semiconductor device illustrated in FIG. 1 extend from package body 17 and are exposed on the package body perimeter. Second contact portions 20 are illustrated as bending downward, substantially conforming to package body 17; however, second contact portions 20 can take on a number of forms. The form of second contact portions 20 illustrated in FIG. 1 is suitable for use as an electrical test or burn-in contact. Rather than having to test the device through use of first contact portions 18, which may be difficult without appropriate testing equipment, second contact portions 20 can easily be formed into a suitable lead configuration. Alternatively, second contact portions can be servered, for instance at points A of FIG. 1, to make semiconductor device 10 a "leadless" device. The device would be considered leadless because no leads would extend from the package periphery as in conventional leaded devices. Servering the leads can occur at any point in the manufacturing of the device after encapsulation, depending upon whether or not second contact portions 20 are required for testing or for other purposes.

Intermediate portions 22 of the leads are those portions situated between first contact portions 18 and second contact portions 20. The intermediate portions 22 are fully encapsulated within package body 17, as illustrated in FIG. 1. Having these portions encapsulated serves to secure leads 14 in place within package body 17 and also provides a suitable area to place wire bonds 16. The positions of the intermediate portions of the leads within package body 17 can be adjusted to optimize wire bonding operations. For instance, it is often advantageous to have the bonding surface of the intermediate portion of the lead in the same plane as the bonding surface of the die. Furthermore, it may be beneficial to bond one or all wire bonds 16 to another portion of a respective one of leads 14, for example to an unexposed portion of first contact portion 18 rather than to the intermediate portion 22. Wire bonding to an unexposed portions of first contact portions 18 is illustrated in FIG. 1 by dashed wire bonds 23.

Figure 2:
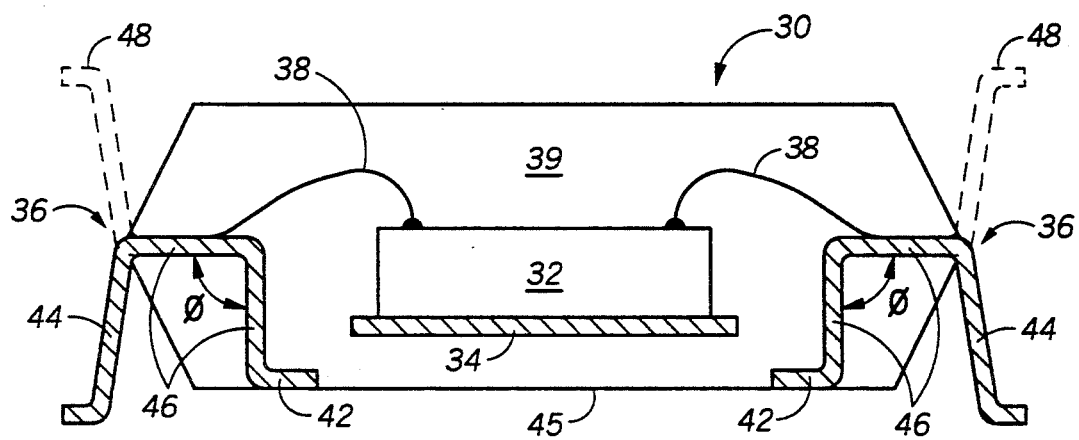
FIG. 2 illustrates, in cross-section, a semiconductor device also in accordance with the present invention.

Illustrated in cross-section in FIG. 2 is another embodiment of the present invention. A semiconductor device 30 has a semiconductor device die 32 positioned on a die receiving area 34 of a leadframe (not entirely shown). The leadframe also has a plurality of leads 36 which are electrically coupled to the semiconductor die by wire bonds 38. The embodiment of the present invention illustrated in FIG. 2 shows examples of different lead configurations and different die positions which are suited for use with the invention. For example, die 32 can be positioned toward the middle of a package body 39 such that die receiving area 34 is completely encapsulated by the packaging material. The configuration of leads 36 is such that a first contact portion 42 is exposed on a bottom surface 45 of package body 39, thus enabling bottom-side electrical contacts. However, should a customer not want or be unable to use bottom-side electrical contacts, second contact portions 44 are also provided. Unlike the previous embodiment which configured the second contact portions into a test contact configuration, the embodiment illustrated in FIG. 2 has a standard gull-wing lead configuration which is suited for surface mounting to a substrate. Other lead configurations external to package body 39, such as J-lead or through-hole, would also be within the scope of the present invention. Furthermore, the second contact portions may extend in a direction different than the direction illustrated in FIG. 2. For example, leads exiting the package body may extend upward, as illustrated by dashed second contact portions 48. Having two choices for electrically contacting the device, namely bottom-side contact or peripheral contact, provides the device user with a flexibility in substrate mounting which is typically not available with conventional devices.

As in the previous embodiment, the leads of semiconductor device 30 have intermediate portions 46 which separate the first and second contact portions. Intermediate portions 46 are encapsulated within package body 39 to help secure leads 36 in appropriate positions. The intermediate portions 46 of the leads in FIG. 2 are used for wire bond bonding sites, although as mentioned earlier any portion of leads 36 internal to package body 39 can be used for a bonding location. The shape of the intermediate portions 46 should be angled or bent by an angle $\phi$ in a way to permit first contact portions 42 to be exposed on a bottom surface 45 of the package body, while the second contact portions 44 will extend from selected package body edges. A suitable shape for intermediate portions 46 to meet this requirement is to provide the intermediate portions with the angle $\phi$. The angle φ is preferably in the range of 90°–150° although other obtuse angles are also suitable.

Figure 3:
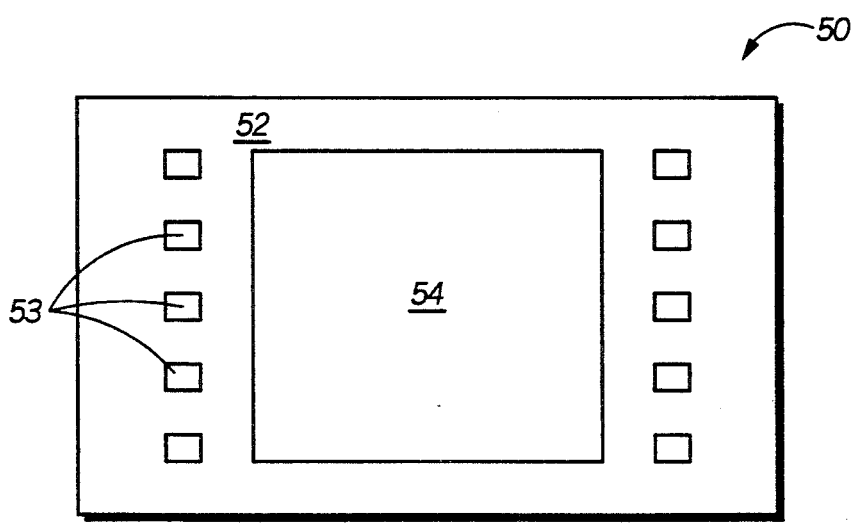
FIG. 3 illustrates, in planar view, the bottom surface of a semiconductor device in accordance with present invention.
Figure 4:
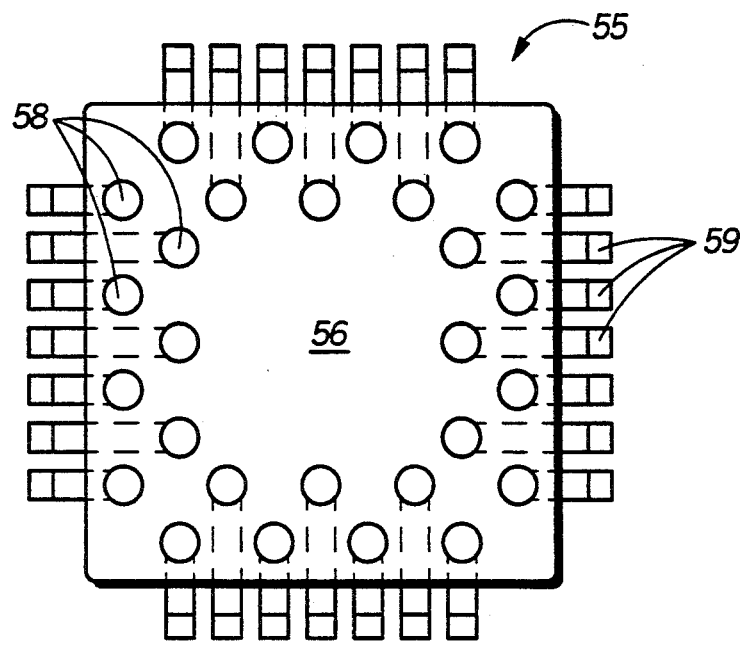
FIG. 4 illustrates, in planar view, suitable solder ball configurations on the bottom surface of a semiconductor device in accordance with the present invention.

FIG. 3 and FIG. 4 illustrate in a planar view two possible bottom-side contact configurations for a semiconductor device in accordance with the present invention. In FIG. 3, a semiconductor device 50 has a plurality of leads (not entirely shown) having first contact portions 53 exposed along a bottom surface of a package body 52. Device 50 also has a die receiving area 54 which is exposed along the bottom surface of the device to aid in thermal performance. It is important to note that while FIG. 3 illustrates exposed first contact portions 53 along only two sides of package body 52, this is not a requirement of the present invention. Furthermore, the invention is not limited to a single row of exposed contact portions along any given side of the package.

Illustrated in FIG. 4, a semiconductor device 55 has a plurality of solder balls 58 along sides of a package body 56. The solder balls 58 are staggered along the package sides, each side having two corresponding rows of solder balls. Having the solder balls staggered allows more electrical contacts to be made to a device without increasing the device size. As the complexity of the device increases, the number of necessary electrical contacts also increases. Therefore, it is conceivable that bottom-side electrical contact configurations may include more than two row of contacts for each side of a package body. Extending from the sides of package body 56 are second contact portions 59 of a plurality of leads which are represented by dashed lines in FIG. 4. As mentioned previously, second contact portions 59 can be configured in a number of ways, for instance as test contact or into standard lead configurations. The second contact portions can also be formed as a result of the leads being severed from the package.

Illustrated in FIG. 5 and FIG. 6 are methods in which a semiconductor device in accordance with the present invention can be mounted to a substrate, such as a PC board, to improve heat dissipation from the device. In FIG. 5, a semiconductor device 60 has a semiconductor device die 62 positioned at a die receiving area 64 which is exposed on a bottom surface of a package body 65. The die is electrically coupled to a plurality of leads 66 via wire bonds 67. While leads 66 have first contact portions 68, intermediate portions 69, and second contact portions 71 as in previous embodiments, notice that second contact portions 71 are portions of the leads which are exposed on, and substantially flush with, the periphery of package body 65 as a result of the leads being severed.

In addition to illustrating a leadless semiconductor device in accordance with the present invention, FIG. 5 also illustrates a method in which such a device can be mounted to a substrate to improve thermal performance. Attached to each of first contact portions 68 and portions of die receiving are 64 are solder balls 72. Solder balls 72 can be attached to semiconductor device 60 in several ways, for instance by using a solder mask 74. The solder mask is formed on device 60 and patterned in a conventional manner to expose portions of the device to which solder balls will be attached. A solder mask is particularly useful in attaching solder balls to die receiving area 64 since specific locations for the solder balls on the die receiving are not otherwise defined. Solder balls are then placed on the device and attached, usually by reflowing the solder. As FIG. 5 illustrates, the solder balls which are attached to the first contact portions are attached to a corresponding plurality of patterned conductive traces 78 which are formed on a substrate, in this case a PC board 75. Conductive traces 78 are used to electrically access semiconductor device die 62 from PC board 75. The solder balls which are attached to die receiving area 64 are also attached to thermal vias 79 that are formed in PC board 75. Thermal vias 79 provide a direct path from semiconductor device die 62 through PC board 75. Thus, heat can more effectively be removed from device 60 to the ambient. Thermal vias usually have one of two forms, either filled or unfilled. Filled thermal vias typically contain solder, thermally conductive epoxy, or other material which aids in heat dissipation. Unfilled vias, as the name suggests, do not contain such materials but are air-filled.

An alternative to using thermal vias in a PC board is to use a cold plate. As illustrated in FIG. 6, semiconductor device 60 is electrically coupled to a plurality of conductive traces 81 of a PC board 82 through the use of solder balls 83. Solder balls 83 of FIG. 6 appear differently than other solder balls previously illustrated. This is due to the fact that during solder reflow, round solder balls can flow into an hourglass shape if the position of a semiconductor device relative to a substrate is permitted to vary. As known in the industry, hourglass-shaped solder joints improves solder joint fatigue life. Rather than having solder balls attached to die receiving area 64 and to thermal vias as in FIG. 5, a cold plate 84 is provided as part of PC board 82. Cold plate 84 is in direct contact with die receiving area 64 to provide optimal thermal dissipation from semiconductor device die 62. The device of FIG. 6 uses flowed solder balls 83 to pull, by surface tension, device 60 closer to PC board 82 which improves the thermal contact between die receiving area 64 and cold plate 84. Cold plate 84 extends through PC board 82 to release heat to the ambient to allow the device to operate at a suitable temperature. Suitable cold plate materials include aluminum, copper, and other thermally conductive materials.

Figure 7:
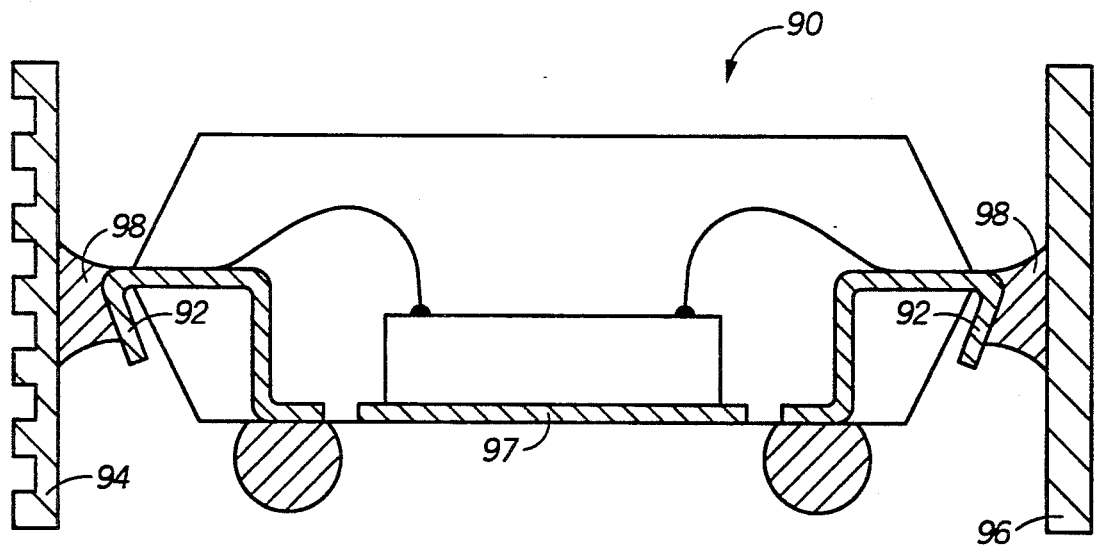
FIG. 7 illustrates, in cross-section, additional applications in which a semiconductor device in accordance with the present invention can provide improved thermal performance.

Not only does the present invention permit two ways to electrically access a semiconductor device, but also provides various ways to remove heat from the device. As illustrated in FIGS. 5 and 6, heat may be removed from a device in accordance with the present invention through the bottom or top of the device by having the die receiving area exposed on a surface of the package body. In addition, heat may also be removed via the exposed second contact portions along the package body periphery, as illustrated in FIG. 7. A semiconductor device 90 in accordance with the present invention is equipped with peripheral heat removers, such as thermal conductors 94 and 96, which are coupled to second contact portions 92 of a plurality of leads (not entirely shown). The conductors are coupled to second contact portions using a thermally conductive epoxy 98. Thermally conductive epoxy 98 is not electrically conductive since an electrically conductive epoxy would short-circuit the leads. Second contact portions 92 of FIG. 7 are similar to second contact portions of previously discussed embodiments of the invention and may have any of the previously mentioned configurations. Thermal conductors 94 and 96 provide substantial heat removal and may be shaped and positioned such that heat removal is optimized. Heat is also removed through a exposed surface of a die receiving area 97 as in other embodiments of the invention. The peripheral heat removal methods illustrated in FIG. 7 can be modified in numerous ways and are illustrated only as examples of suitable thermal enhancements which can be used with a semiconductor device in accordance with the present invention.

Overall, the present invention provides great flexibility to both manufacturers and customers of semiconductor devices and has other desirable features. For instance a device of the present invention can have a standard peripheral lead configuration, a test contact configuration or can be leadless. Bottom-side electrical connections are available as a result of first contact portions of the leads which are exposed on a surface of the package body. Bottom side connections to a substrate can be made with, for example, solder balls or screen printed solder and reflow techniques. Furthermore, the present invention has an additional advantage in that it can enhance thermal performance of a device easily by exposing the die receiving area on a surface of the package body as well.

Thus it is apparent that there has been provided, in accordance with the invention, a semiconductor device having dual electrical contact sites and a method for making the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in packages having one semiconductor die, but may also be used with multiple component semiconductor devices. Nor is the invention limited to mounting a device in accordance with the invention in the mounting methods described and illustrated. Furthermore, the invention is not limited to using solder balls as a method of coupling the device to a substrate. In addition, it is not intended that the invention be limited to element materials specifically mentioned. Therefore, it is intended that this invention encompass all such variations and modifications as fall within the scope of the appended claims.

We claim:

1. A semiconductor device having dual electrical contact sites comprising:
   a leadframe having a die receiving area and a plurality of leads extending outwardly from positions adjacent the die receiving area, each of the leads having first and second contact portions and an intermediate portion, the first contact portion being formed from a proximal end of the lead and the second contact portion being formed from a distal end of the lead, the first and second contact portions being separated by the intermediate portion;
   a semiconductor device die positioned at the die receiving area of the leadframe and electrically coupled to the
   intermediate portions of the plurality of leads; and a package body having a top surface, a bottom surface, and a perimeter, the package body encapsulating the semiconductor device die and intermediate portions of the plurality of leads such that the first contact portions of the leads are partially exposed on the bottom surface of the package body and the second contact portions extend from the package body along a portion of the perimeter.

2. The semiconductor device of claim 1 wherein the first contact portions of the leads are partially exposed on the bottom surface of the package body and substantially flush with the bottom surface.

3. The semiconductor device of claim 1 wherein the die receiving area of the leadframe is exposed on one of either the top surface or the bottom surface of the package body.

4. The semiconductor device of claim 1 wherein the second contact portions of the leads extend from the package body and have an angular configuration which conforms to a side of the package body.

5. The semiconductor device of claim 1 wherein the second contact portions extend from the package body along the perimeter and have a lead configuration selected from the group consisting of J-lead, gull-wing, and through-hole.

6. The semiconductor device of claim 1 wherein each of the second contact portions comprise a portion of the lead which is exposed at the perimeter of the package body and is flush with a side of the package body as a result of being severed.

7. The semiconductor device of claim 6 further comprising means for electrically coupling the first contact portions exposed on the bottom surface of the package body to a substrate.

8. The semiconductor device of claim 7 wherein the means for electrically coupling the first contact portions to a substrate comprises solder.

9. The semiconductor device of claim 7 wherein the means for electrically coupling the first contact portions to a substrate comprises a plurality of solder balls, each solder ball coupling one of the first contact portions to the substrate.

10. A semiconductor device having dual electrical contact sites comprising:
    a semiconductor device die;
    a plurality of conductive leads, each lead having a first contact portion formed from a proximal end of the lead and a second contact potion formed from a distal end of the lead, the second contact portion being separated from the first contact portion by an intermediate portion;
    means for electrically coupling either the intermediate or proximal portion of each conductive lead to the semiconductor device die; and
    a package body encapsulating the semiconductor device die, the means for electrically coupling, and intermediate portions of the plurality of conductive leads such that each first contact portion is exposed on a surface of the package body and such that each second contact portion is exposed on a side of the package body which is adjacent the surface.

11. The semiconductor device of claim 10 wherein the first contact portions exposed on the surface of the package body are substantially flush with the surface of the package body.

12. The semiconductor device of claim 10 further comprising a die receiving area for receiving the semiconductor device die and wherein a surface of the die receiving area is exposed on and flush with the surface of the package body.

13. The semiconductor device of claim 10 wherein each of the second contact portions comprise a portion of the lead which is exposed at the perimeter of the package body and is flush with a side of the package body as a result of being served.

14. The semiconductor device of claim 10 wherein the first contact portion of each of the plurality of leads intersects the intermediate portion at an obtuse angle.

15. the semiconductor device of claim 10 wherein the second contact portions of the leads extend from the package body and have an angular configuration which conform to a side of the package body.

* * * * *